United States Patent [19]

Ballato

[11] Patent Number: 4,598,261
[45] Date of Patent: Jul. 1, 1986

[54] MICROWAVE SAW MONOCHROMATOR

[75] Inventor: Arthur Ballato, Long Branch, N.J.

[73] Assignee: The United States of America as represented by the Secretary of the Army, Washington, D.C.

[21] Appl. No.: 737,627

[22] Filed: May 24, 1985

[51] Int. Cl.[4] .............................................. H03H 9/64
[52] U.S. Cl. ................................ 333/195; 310/313 D; 333/153; 333/188; 333/196
[58] Field of Search ................... 333/150–155, 333/193–196, 186–188, 141–143; 310/313 A, 313 B, 313 C, 313 D

[56] References Cited

U.S. PATENT DOCUMENTS

| | | | |
|---|---|---|---|
| 3,446,975 | 5/1969 | Adler et al. | 333/196 X |
| 4,268,808 | 5/1981 | Melngailis | 333/195 |
| 4,342,970 | 8/1982 | Melngailis et al. | 333/195 X |
| 4,388,146 | 6/1983 | Ballato | 156/626 |
| 4,389,275 | 6/1983 | Ballato | 156/626 |
| 4,472,694 | 9/1984 | Lee | 333/151 X |

OTHER PUBLICATIONS

Sabine–"Rayleigh-Wave Propagation on a Periodically Roughened Surface", Electronics Letters, Mar. 19, 1970, vol. 6, No. 6; pp. 149–151.
Lukaszek et al–"What Saw Can Learn From Baw . . . ", 1980 Ultrasonics Symposium Proceedings, Nov. 1980; pp. 173–183.
Ballato–"Transduction of Acoustic Surface Waves by Interdigital Arrays . . . ", Research and Development Technical Report Ecom–4359, U.S. Army Electronics Command, Fort Monmouth, N.J., Oct. 1975.
Rischbieter–"Messungen an Oberflachenwellen in Festen Korpern", Acoustica, vol. 16, (1965/66); pp. 75–83.
Vig et al–"Etching Studies on Singly and Doubly Rotated Quartz Plates", Proceedings 3rd Annual Frequency Control Symposium, May 30–Jun. 1, 1975; pp. 351–358.
Humphryes–"Acoustic Bulk–Surface–Wave Transducer", Electronics Letters, May 1, 1969, vol. 5, No. 9; pp. 175–176.

Primary Examiner—Marvin L. Nussbaum
Attorney, Agent, or Firm—Anthony T. Lane; Jeremiah G. Murray; John T. Rehberg

[57] ABSTRACT

An acoustic surface wave device is configured as a bandpass filter. The device has similar groups of sinusoidal corrugations cut into portions of both the top and bottom surfaces of an otherwise flat piezoelectric substrate. A pair of input interdigital transducers is located upon one end of the top flat surface of the substrate. A similar pair of output interdigital transducers is located on the bottom flat surface of the substrate at the end opposite the input interdigital transducers. When an input RF spectral signal is applied to the input interdigital transducers, the transducers convert the electrical signal spectrum to a surface acoustic wave spectrum. When the surface acoustic wave spectrum strikes the corrugations cut into the top surface of the substrate, the corrugations selectively scatter certain spectral components into bulk vibration. The bulk vibration strikes the similar corrugations located upon the bottom of the substrate and the bulk vibratory energy is efficiently reconverted to surface acoustic vibration which propagates along the bottom surface of the substrate. The surface acoustic waves propagating along the bottom of the substrate are highly monochromatic because only certain special components of the wave propagating on the top surface are efficiently transduced by the two groups of corrugations to the bottom surface. The monochromatic surface acoustic waves propagating on the bottom surface are reconverted to an electrical signal by the pair of interdigital transducers located upon the bottom surface.

13 Claims, 10 Drawing Figures

MICROWAVE SAW MONOCHROMATOR

The invention described may be manufactured, used and licensed by or for the Government without payment to me of any royalty thereon.

BACKGROUND OF THE INVENTION

1. Field of the Invention

This invention relates generally to bandpass filters and more particularly to solid state microwave bandpass filters which utilize both surface and bulk acoustic waves in a piezoelectric medium.

2. Description of the Prior Art

Surface acoustic wave (SAW) devices are often employed as filters or resonators in high frequency circuit applications.

The advantages of using SAW devices over other frequency control methods such as LC circuits, coaxial delay lines, or cavity resonators are high Q, low series resistance, small size and good frequency stability. SAW resonators also possess advantages over bulk acoustic wave (BAW) resonators because the latter must be cut very thin to achieve high frequencies and are consequently quite fragile.

Typically, a SAW device contains a substrate of piezoelectric material such as quartz, lithium niobate, zinc oxide, or cadmium sulfide. Input and output transducers are formed upon the substrate. Transducers convert input electrical signals to surface acoustic waves (SAWs) propagating upon the surface of the substrate and then reconvert the acoustic energy to an electric output signal. The input and output transducers are frequently configured as interdigital electrode fingers which extend from pairs of transducer pads. Interdigital transducers may be formed by depositing a thin film of electrical conductive material upon a piezoelectric substrate.

Alternating electrical potential applied to the input interdigital transducers induces mechanical stresses in the piezoelectric substrate. The resulting strains propagate away from the input transducer along the surface of the substrate in the form of surface acoustic waves. These propagating surface waves arrive at the output interdigital transducer where they are reconverted to electrical signals.

SAW devices are often used as filters in a variety of applications. Compared to LC filters, for example, SAW devices can provide a narrower passband and the SAW package occupies much less physical space then an LC filter. The SAW device passband is generally determined by the number of interdigital electrode fingers and by the spacing between the fingers. Center-to-center spacing between interdigital electrode fingers is approximately one-half the wavelength of the surface acoustic wave which is most effectively transduced. A large number of interdigital fingers provides a narrower spectrum than a small number of interdigital fingers. The present invention meets the need for SAW devices with precisely tailored bandpass characteristics. The inventive device described herein is capable of providing a narrow bandpass spectrum without requiring as many interdigital fingers as the prior art.

An article pertinent to the understanding of the present invention which discusses the propagation of both surface acoustic waves and bulk acoustic waves is: P. V. H. Sabine, "Rayleigh-Wave propagation on a periodically roughened surface," Electronics Letters Vol. 6, No. 6, 19 March 1970, pp. 149-151. The Sabine article discussed a phenomenon peculiar to surface wave propagation upon a medium with a non-flat surface. The article presents results which show that surface acoustic waves suffer sharp attenuation when traveling over a medium surface corrugated in a sinusoidal shape. The sinusoidal corrugations cause a scattering of selected surface acoustic wavelengths into bulk vibration in both longitudinal and shear modes. The bulk vibratory modes withdraw energy from selected SAW wavelength components, resulting in attenuation of those components, while permitting other spectral components to traverse the surface relatively undiminished.

Applicant's copending application entitled "Microwave Band Stop Filter" Ser. No. 732,120, filed May 9, 1985, discloses a SAW device which utilizes groups of sinusoidal corrugations positioned between input and output transducers to eliminate unwanted surface wave components by driving them into bulk vibration. The present invention is an extension of the teachings of Ser. No. 732,120.

Another article pertinent to the understanding of the present invention is: R. M. Humphryes et al., "Acoustic Bulk-Surface-Wave Transducer," Electronics Letters, Vol. 5, No. 9, 1 May, 1969, pp. 175-6. The Humphryes article descibes a physical principle complementary to the principle discussed by Sabine. Humphryes teaches that a surface acoustic wave may be generated when a periodically roughened surface is irradiated by a bulk acoustic wave.

The effectiveness of both the scattering of SAW wavelength components into bulk vibration and the generation of SAW components from bulk vibration depends upon the wavelength of the sinusoidal corrugations. For a SAW (Rayleigh) wave of wavelength $\lambda_R$ and sinusoidal corrugations of wavelength $\lambda$, both effective scattering and effective generation of SAW components with wavelength $\lambda_R$ occur when:

$$\alpha = \lambda_R/\lambda$$

The values of $\alpha$ depends only upon the Poisson's ratio of the medium. Poisson's ratio is a physical constant which characterizes the behavior of a solid under stress. When a typical isotropic body is stretched in one direction, the body contracts at right angles (i.e. laterally) to the stretch.) Poisson's ratio, $\sigma$, is the ratio of lateral percentage contraction to longitudinal percentage extension. Poisson's ratio can also be expressed as a ratio of material elastic constants or compliances. Values of Poisson's ratio may range from 0 to 0.50. An isotropic body has a single value for Poisson's ratio. However, an anisotropic body, such as quartz or other piezoelectrics commonly employed as substrates for SAW devices, may be characterized by several Poisson's ratios. The Sabine reference presents data appropriate to isotropic media, but the applicability of the results to anisotropic media is apparent to those skilled in the art, and will be illustrated later. For simplicity, the scattering phenomenon will be discussed first in terms of an isotropic medium. In an isotropic body with Poisson's ratio, $\sigma = 0.1$, if a surface acoustic wave of wavelength $\lambda_R$ (Rayleigh wavelength) is incident upon sinusoidal corrugations of wavelength $\lambda$, strong scattering of the incident surface acoustic wave into bulk vibration will occur when $\alpha = 0.5$ or when $\alpha = 1.7$. Thus, for example, strong scattering of SAW components of wavelength $\lambda_R$ occurs when $0.5 = \lambda_R/\lambda$, or $\lambda = 2\lambda_R$. Sinusoidal corrugations with a wavelength, $\lambda$, equal to twice the wavelength $\lambda_R$ of a Rayleigh SAW wave will scatter that wave into bulk vibration in the longitudinal and shear modes. (Actually, Sabine presents scattering data in terms of the parameter $\lambda_S$, where $\lambda_S$ is the medium shear wavelength and $\lambda$ is the surface corrugation wavelength. However, it is well known to those skilled in the art that the Rayleigh velocity is constrained to be only slightly less than the bulk shear velocity for isotropic media and the Rayleigh velocity is only 2% or 3% less than the slower bulk shear velocity for anisotropic media. Consequently $\lambda_R$ approximately equals $\lambda_S$. For convenience, the invention will be discussed in terms of Rayleigh wavelengths, $\lambda_R$. Sabine's results are merely normalized in terms of $\lambda_S$ for mathematical convenience.) The amplitude of the surface acoustic wave spectral component of wavelength $\lambda_R$ after scattering is substantially diminished. The pricise amount of scattering depends upon the number of sinusoidal corrugations encountered by the incident surface acoustic wave. Greater scattering is produced by a large number of corrugations than by a small number. For Poisson's ratio, $\sigma = 0.1$, in an isotropic medium, for example, the condition $0.5 = \lambda_R/\lambda$ yields an attenuation (and consequent scattering) as great as 10 dB per corrugation wavelength. Thus, surface waves of wavelength $\lambda_R = \lambda/2$ propagating in such a medium would be attenuated by scattering approximately 100 dB after traversing 10 corrugations.

As Poisson's ratio of the medium becomes larger, the SAW attenuation curve, illustrated by Sabine, becomes lower and broader. However, the principles of SAW scattering and generation by sinusoidal corrugations remain unchanged even for an anisotropic medium, as will be discussed below.

BRIEF SUMMARY OF THE INVENTION

It is an object of the present invention to provide a simple, relatively inexpensive, compact microwave bandpass filter.

It is another object of the present invention to provide an effective SAW device which is amenable to mass production techniques.

A further object of the present invention is to provide a SAW filter with hitherto unachievably narrow bandpass characteristics.

Still another object of the present invention is to provide a device capable of bandpass filtering by utilizing groups of sinusoidal corrugations disposed upon both the top and bottom surfaces of a piezoelectric substrate to transduce predetermined signal wavelengths.

The present invention utilizes the aforementioned principles of SAW scattering and generation by surface sinusoidal corrugations to produce any electronic bandpass filter with a precisely tailored passband. The inventive device features a series of input interdigital transducers (IDT's) deposited upon the top side side of a piezoelectric substrate. The IDT's convert an input electrical RF signal to surface acoustic wave vibrations of the piezoelectric substrate. One or more groups of sinusoidal corrugations are cut into the top surface of the piezoelectric substrate. The groups of corrugations are positioned in the path of, and transverse to, the surface acoustic waves emanating from the IDT's. Each group of sinusoidal corrugations scatters a selected SAW wavelength into bulk vibrations of the substrate. On the bottom side of the piezoelectric substrate there are identical groups of sinusoidal corrugations. The groups of corrugations on the bottom side of the substrate convert the bulk vibrations which are incident upon them into surface acoustic waves which propagate along the bottom side of the substrate. A set of output IDT's is deposited upon the bottom side of the substrate in the path of the SAW vibrations generated by the groups of sinusoidal corrugations on the bottom side of the substrate. The output IDT's convert the SAW energy incident upon them back to an electrical signal. Thus, the inventive device utilizes groups of sinusoidal corrugations cut into both the top and the bottom surface of the piezoelectric substrate. Each group of corrugations on the top surface converts a selected SAW wavelength component into bulk vibration. The bottom groups of sinusoidal corrugations reconvert the bulk vibration to SAW vibration. The output IDT's see only those wavelength components which have been scattered by the top groups of corrugations and reconverted by the bottom groups of corrugations.

The bandpass characteristics of the device may be tailored by adjusting the number of corrugations in a group, the number of groups, and the wavelengths of each group.

Absorbing material is attached to the top surface of the piezoelectric substrate adjacent to the sinusoidal corrugations and above the output IDT's. The aborbing material serves to prevent spurious reflections which might impede the operation of the device.

Additional absorbing material may be placed on the bottom surface of the piezoelectric substrate beneath the input IDTs. The bandpass characteristics of the device may be broadened by placing several groups of similar sinusoidal corrugations on both the top and bottom surfaces of the substrate. Each of the similar top-bottom groups of corrugations is capable of transducing a predetermined surface acoustic wavelength by the mechanism just described. The output of the device, measured at the output IDT, will contain only those spectral components which have traveled from the top surface of the substrate to the bottom surface of the substrate by the aforementioned scattering and reconversion mechanism. Thus, the spectral output of the device may be broadened. An alternative embodiment of the inventive device features the sawtooth corrugations instead of sinusoidal corrugations. Sawtooth corrugations are somewhat less expensive to fabricate then sinusoidal corrugations, but sawtooth corrugations provide a less effective scattering than sinusoidal corrugations. Hence a greater number of sawtooth corrugations is required to achieve effective operation.

Further objects and advantages of the present invention will become apparent to those familiar with the art upon examination of the detailed description and accompanying drawings.

DESCRIPTION OF THE PREFERRED EMBODIMENT

Figure 1:
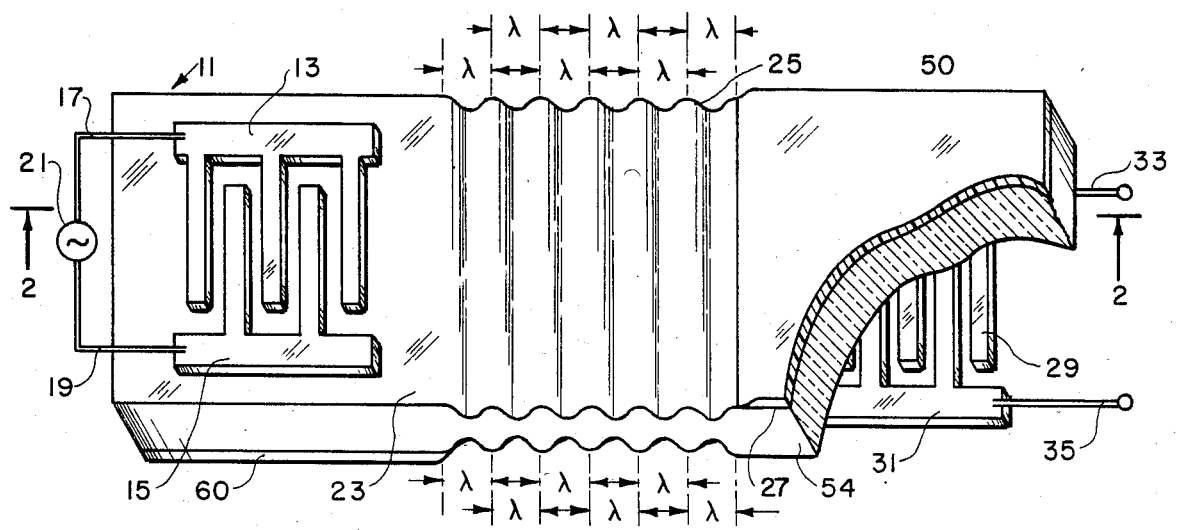
FIG. 1 is a perspective view of one preferred embodiment of the present invention.

Referring to the drawings, and more particularly to FIG. 1, wherein like numerals referred to like components throughout, reference numeral 11 designates generally a piezoelectric substrate. In the preferred embodiment, the piezoelectric substrate is ST-cut quartz, although other quartz cuts, such as SST-cut quartz in other piezoelectric materials such as lithium niobate are acceptable. SST-cut quartz is described in Lukaszek and Ballato, "What SAW Can Learn from BAW: Implications for Future Frequency Control, Selection & Signal Processing," Proc. 1980 IEEE Ultrasonics Symposium, November 1980, pp. 173-183. A pair of input interdigital transducers 13 and 15 is deposited on the top surface of the piezoelectric substrate. The input transducers are connected by connectors 17 and 19 to an external RF source 21. When the input signal 21 is applied to the transducers 13 and 15, the transducers stimulate the piezoelectric substrate 11 and surface acoustic waves propagate along the flat substrate surface 23.

Reference numeral 25 designates a group of sinusoidal corrugations cut into the top of the otherwise flat piezoelectric surface 11. The corrugations may be easily cut by utilizing the ion milling or photolitc etching techniques taught in U.S. Pat. Nos. 4,388,146 and 4,389,275, both issued to the present inventor. In the embodiment ilustrated in FIG. 1, all of the corrugations in the group 25 have the same wavelength, $\lambda$. When surface acoustic waves emanating from the interdigital transducers 13 and 15 encounter the corrugations 25, the surface waves with wavelengths $\lambda_R$, satisfying the scattering criteria for the substrate are scattered into bulk acoustic vibration. The scattered components are eliminated from the surface acoustic spectrum traversing the top of the piezoelectric 11. A layer of absorbing material 50 is positioned on the top surface 27 of the piezoelectric substrate 11. The absorbing material absorbs all of the surface acoustic vibration components which traverse the group of corrugations 25 and which are not scattered into bulk vibration and prevents reflection of surface acoustic vibrations which may otherwise interfere with the transduction process. Tape, Glyptal TM, polyimide, and various glues, gums or resins will produce satisfactory absorption.

A second group of sinusoidal corrugations 52 is cut into the bottom surface of the piezoelectric 11. The second group of corrugations 52 is positioned directly below the first group of corrugations 25. The second group of corrugations 52 has same wavelength $\lambda$, as the corrugations 25 at the top surface of the piezoelectric 11. When the bulk acoustic waves scattered from the corrugations 25 on the top surface of the piezoelectric 11 are incident upon the corrugations 52 on the bottom surface of the piezoelectric 11, the bulk vibrations are reconverted to surface acoustic waves. The surface acoustic waves generated from the corrugations 52 upon the bottom surface of the piezoelectric 11 encounter a second set of interdigital transducers 29 and 31 deposited upon the bottom surface of the piezoelectric 11. The interdigital transducers 29 and 31 convert the surface acoustic vibrations incident upon them into an electrical signal which is transmitted by connectors 33 and 35 to external circuitry. A second absorbing layer 60 may be placed upon the bottom surface of the substrate to absorb any SAW waves which propagate in a direction away from the output IDTs 33 and 35. Tape, Glyptal TM, polyimide, and various glues, gums or resins will produce satisfactory sound absorption.

The foregoing has illustrated how the presence of a group of sinusoidal corrugations 25 positioned on a piezoelectric substrate between two uniformly flat surfaces 23 and 27 converts incident SAW waves into bulk acoustic vibration. A second set of identical corrugations 52 positioned on the underside of the same substrate reconverts the bulk acoustic waves incident upon them into SAW vibration. Only those component wavelengths, $\lambda_R$, which satisfy the scattering criteria for the substrate are scattered into bulk vibration and subsequently reconverted to surface acoustic vibration. The top 25 and bottom 52 corrugations serve as a narrow bandpass filter.

The amplitude of the individual corrugation 25 and 52 on both the top and the bottom of the piezoelectric substrate must be small compared to a Rayleigh wavelength. The aforementioned article by Sabine presents results based on the formula:

$$\xi_o/\lambda = 0.01$$

where $2\xi_o$ is the peak-to-valley amplitude of the sinusoidal corrugations, and $\lambda$ is the corrugation wavelength.

As indicated by Sabine, greater scattering of SAW vibration into bulk vibration is achieved by a large number of corrugations 25 than by a small number. Similarly, more efficient conversion of bulk acoustic vibration into surface acoustic vibration is accomplished by a large number of corrugations 52 than by a small number. Therefore, most efficient transduction is accomplished by positioning a relatively large number of wavelengths on both the top and bottom surface of the substrate. Typically, between 10 and 1000 corrugations 25 and 52 on both top and bottom of the substrate are satisfactory.

Figure 5:
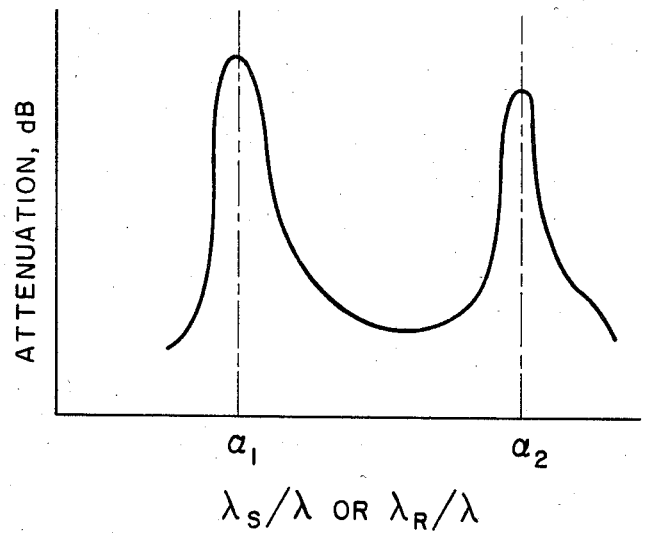
FIG. 5 is a graph illustrative of the surface wave attenuation curve for a piezoelectric substrate.

The efficiency of conversion of SAW vibration into bulk acoustic (BAW) vibration and vice-versa depends, as shown by the Sabine reference, upon the Poisson's ratio of the substrate. Sabine presents data appropriate for an isotropic substrate. Piezoelectric materials are anisotropic, and as mentioned before, may be characterized by several Poisson's ratios. Consequently, the precise shape of the SAW attentuation curve of a piezoelectric depends upon the mathematical combination of the several values of the Poisson's ratios. For a given crystal material and crystal cut the SAW attentuation curve will vary slightly from the shapes showed by Sabine because of its dependence upon several Poisson's ratios. However, the two-peaked shape of the curve as shown in FIG. 5 persists, although the width of each peak and the precise location of the peaks as a function of $\lambda_R/\lambda$ depends upon the mathematical mix of Poisson's ratios for the appropriate crystalline material and cut.

Sabine's data may be viewed as describing the efficiency of conversion of SAW into BAW by a group of sinusoidal corrugations. FIG. 5 is illustrative of the general shape of the surface wave attenuation curve for a piezoelectric substrate. The attenuation curve exhibits two maxima designated as $\alpha_1$ and $\alpha_2$. The precise values of $\alpha_1$ and $\alpha_2$ as well as the widths of the peaks at $\alpha_1$ and $\alpha_2$ depend upon a mathematical mix of the Poisson's ratios for the particular piezoelectric substrate employed.

Examination of the Poisson's ratios for ST-cut quartz porivdes an indication of the shape of the attenuation curves discussed above. Table 1 below lists the determinative absolute values of Poisson's ratios, calculated as ratios of the crystal elastic constants, $C_{ij}$, where i is from 1 to 3 and j is from 1 to 3.

TABLE 1

$$\left|\frac{C_{12}}{C_{11}}\right| = \frac{8.612}{86.740} = 0.0993$$

$$\left|\frac{C_{12}}{C_{22}}\right| = \frac{8.612}{130.768} = 0.0659$$

$$\left|\frac{C_{13}}{C_{11}}\right| = \frac{27.502}{86.740} = 0.317$$

$$\left|\frac{C_{13}}{C_{33}}\right| = \frac{27.502}{96.868} = 0.284$$

$$\left|\frac{C_{23}}{C_{22}}\right| = \frac{4.938}{130.768} = 0.0378$$

$$\left|\frac{C_{23}}{C_{33}}\right| = \frac{4.938}{96.868} = 0.0510$$

The elastic constant values $C_{ij}$, in Table 1 above are provided in "Transduction of acoustic surface waves by interdigital arrays, and equivalent circuit representations,": Technical Report ECOM-4359, U.S. Army Electronics Command, Fort Monmouth, N.J., October 1975, authored by the present inventor.

Examination of Table 1 shows that Poisson's ratios range between 0.0378 and 0.317. Because the location of the peaks of the aforementioned attenuation (i.e. scattering) curve depends solely upon Poisson's ratios, it is apparent to those skilled in the art who examine the Sabine graphs that peaks for ST-cut quartz occur within the ranges specified below:

$$0.3 \leq \lambda_S/\lambda \leq 0.6$$

$$1.4 \leq \lambda_S/\lambda \leq 2.05$$

and because $\lambda_S \approx \lambda_R$, $$0.3 \leq \lambda_R/\lambda \leq 0.6$$

and $$1.4 \leq \lambda_R/\lambda \leq 2.05$$

or, in terms of FIG. 5

$$0.3 \leq \alpha_1 \leq 0.6$$

$$1.4 \leq \alpha_2 \leq 2.05$$

Thus, the inventive device, when fabricated upon an ST-cut quartz substrate with groups of sinusoidal corrugations of wavelength $\lambda$ on the top and bottom surface of the substrate will efficiently pass certain SAW wavelengths, $\lambda_R$, which fall within the ranges specified below:

$$0.3\lambda \leq \lambda_R \leq 0.6\lambda \text{ and } 1.4\lambda \leq \lambda_R \leq 2.05\lambda$$

The precise SAW wavelengths, $\lambda R$, which are most efficiently transduced by the inventive device depends upon the precise location and shape of the scattering for the piezoelectric substrate. The SAW scattering and reconversion curves for ST-cut quartz, for example, have not been published to the best of this inventor's knowledge.

However, the following one-time procedure will reveal the shape of the SAW attenuation curve for any piezoelectric substrate, while simultaneously yielding a series of devices taught by the above-described inventive procedure.

It is necessary to fabricate a limited number of devices, all devices with identical IDT configurations, and each device with groups of sinusoidal corrugations on both top and bottom surfaces. One device should be fabricated with the same IDT configuration as the others, but with no corrugations. The output spectra of each of the corrugated devices may then be compared with the output of the uncorrugated reference device. Comparison of the output of each of corrugated device with the uncorrugated device will reveal the frequencies which are most efficiently transduced by the sinusoidal corrugations on each device. The procedure is outlined in more detail below.

It is well known to those skilled in the art that the general shape of the SAW spectrum emanating from the input IDTs is determined by the spacing between the individual fingers. Roughly speaking, the central spectral wavelength, $\lambda_{Rc}$ is given by:

$$s = \lambda_{Rc}/2$$

where
 $s =$ spacing between adjacent fingers.

Thus, the spacing between adjacent fingers is approximately one half of the spectral central wavelength. The width of the spectrum is also roughly predictable by those skilled in the art. A large number of IDTs yields a narrow, spectrum, and conversely, a small number of IDTs yields a broader spectrum. Consequently, the spectral shape emanating from a given IDT configuration is generally predictable by those skilled in the art.

Figure 6:
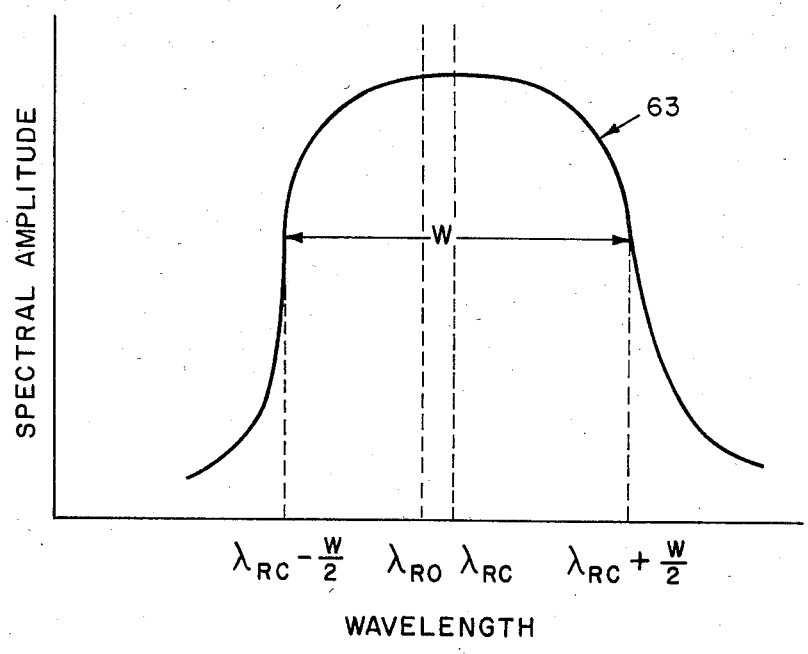
FIG. 6 is a graph of spectral amplitude as a function of wavelength for an uncorrugated prior art device.

FIG. 6 is generally illustrative of a surface acoustic wave spectrum emanating, for example, from input transducers 13 and 15 in FIG. 1. The approximate central wavelength is designated by $\lambda_{RC}$ and the approximate width of the spectrum is designated by W. The input transducers, 13 and 15 may be considered capable of producing wavelengths between $\lambda_{RC}-W/2$ and $\lambda_{RC}+W/2$. To determine the SAW attenuation characteristics (and thus, the value of $\alpha_1$ and $\alpha_2$ in FIG. 5) for a given piezoelectric substrate, one may simply fabricate several devices with identical input and output IDTs. One device should have both the input and output IDT's located upon the top surface of the piezoelectric substrate with no sinusoidal corrugations between them. This device is a typical prior art device. Each of the other devices has an input IDT, a group of sinusoidal corrugations upon its top surface, a second group of identical sinusoidal corrugations and an output IDT both upon its bottom surface, according to the design shown in FIG. 1. The sinusoidal corrugations on the top surface have the same wavelength as the sinusoidal corrugations on the bottom surface. The IDTs upon the top surface are identical in configuration and number with the IDTs upon the bottom surface, and both sets of IDTs are identical in configuration and number with the input and output IDTs deposited upon the top surface of the first-described (uncorrugated, prior-art) device. One device may be fabricated with sinusoidal corrugations on both top and bottom surface with wavelength given, for example, by $\lambda_1 = \lambda_{RO}/0.30$. Each of the other devices may be fabricated with sinusoidal corrugations having wavelengths given by:

$\lambda 2 = \lambda RO 0.35$ $\lambda 3 = \lambda RO/0.40$ $\lambda 4 = \lambda RO/0.45$ $\lambda 5 = \lambda RO/0.50$ $\lambda 6 = \lambda RO/0.55$ $\lambda 7 = \lambda RO/0.60$ where $\lambda_{RO}$ is a strong spectral component observable in the SAW spectrum of the first uncorrugated device. For example, $\lambda_{RO}$ may be selected as the central spectral wavelength, $\lambda_{RC}$, or any other wavelength in the range $\lambda_{RC}-W/2$ to $\lambda_{RC}+W/2$. In the example of FIG. 6, $\lambda_{ro}$ is chosen to be slightly less than $\lambda_{RC}$. The above equations are derived from the aforementioned relationship for the location of the SAW attenuation curve peak, name $0.3 \leq \lambda R/\lambda \leq 0.6$, or $0.3 \leq \alpha_1 \leq 0.6$.

Simple spectal analysis of the outputs of each of the aforementioned corrugated devices and the comparison of the output spectra of the corrugated devices with the uncorrugated device will indicate the corrugation wavelength $\lambda i$, $i=1, \ldots 7$ which most efficiently transduces $\lambda_{RO}$. Further comparison of the output spectra of the corrugated devices with the uncorrugated device will show which spectral wavelengths are most efficiently transduced by specific corrugation wavelengths, thus yielding the shape, width, and the location of $\alpha_1$ in the SAW attenuation curve of FIG. 5 for the piezoelectric substrate. Further refinement of the curve shape follows simply from experiments at corrugation wavelengths intermediate to those in the example above.

Figure 7:
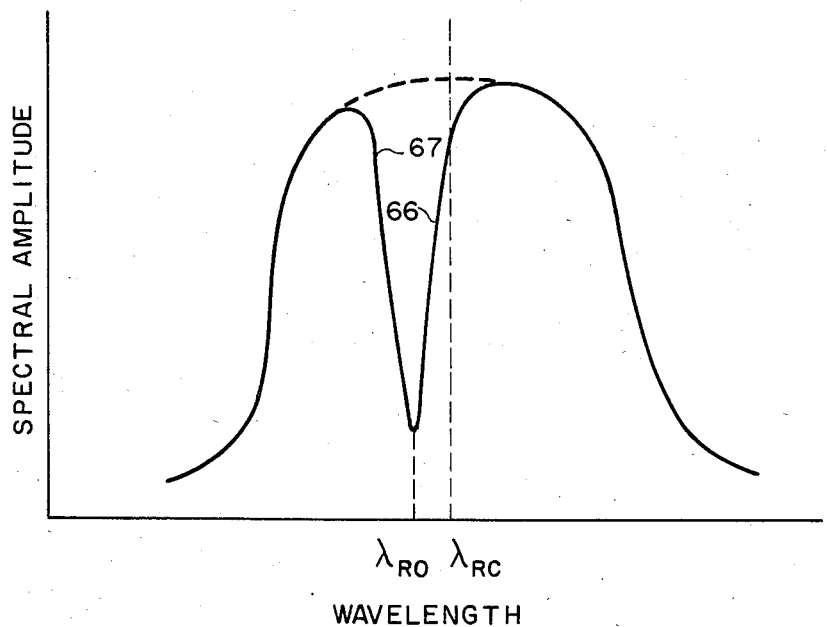
FIG. 7 is a graph of an intermediate spectral amplitude as a function of wavelength partially illustrative of one embodiment of the function of the present inventive device.

FIG. 7 is illustrative of the intermediate spectral amplitude curve of the surface acoustic wave vibrations which arrive at substrate surface 27 of the embodiment of FIG. 1. The notch defined by lines 66 and 67 corresponds to the wavelength component $\lambda_{RO}$ which is first scattered into BAW by corrugations 25 then reconverted to SAW by the corrugations 52 and which then propagates as SAW upon the bottom surface 54 of the substrate.

Figure 9:
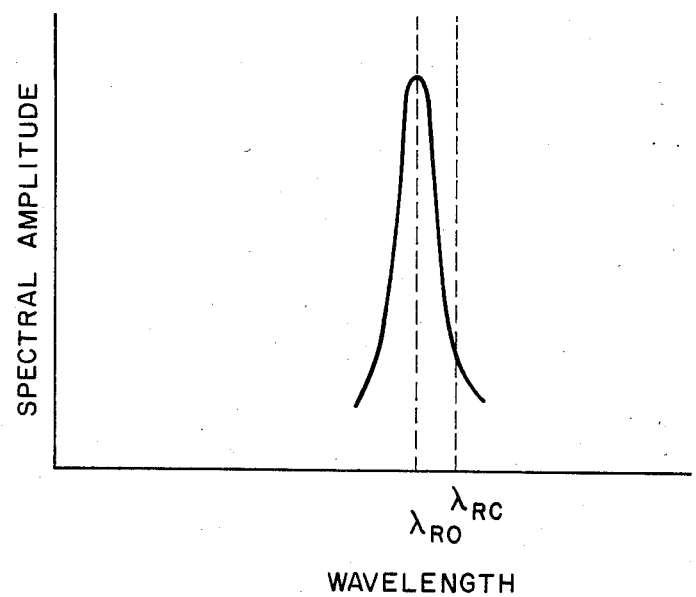
FIG. 9 is a graph of output spectral amplitude as a function of wavelength for one preferred embodiment of the present invention.

FIG. 9 is illustrative of the output spectral amplitude of the surface acoustic vibration propagating upon the bottom surface 54 and intercepted by IDTs 29 and 31. The curve is characteristic of the output measured at terminals 33 and 35 of the embodiment of FIG. 1. Of course the same SAW wavelength, $\lambda_{R0}$ could be transduced by a device fabricated according to the second SAW attenuation peak, located at $1.4 \leq \lambda_{R0}/\lambda \leq 2.05$. Experiments to determine the SAW attenuation characteristic would, for example, use devices with corrugations having wavelengths $\lambda_8-\lambda_{15}$ in accord with the following formulas:

$\lambda 8 = \lambda_{R0}/1.4$ $\lambda 9 = \lambda_{R0}/1.5$ $\lambda 10 = \lambda_{R0}/1.6$ $\lambda 11 = \lambda_{R0}/1.7$ $\lambda 12 = \lambda_{R0}/1.8$ $\lambda 13 = \lambda_{R0}/1.9$ $\lambda 14 = \lambda_{R0}/2.0$ $\lambda 15 = \lambda_{R0}/2.05$ The above equations are derived from the aforementioned relationship for the location of the SAW attenuation curve peak, namely $1.4 \leq \lambda R/\lambda \leq 2.05$, and may be augmented by others, as described above, for further refinement of the characteristic curve. However, corrugations with wavelengths $\lambda 1-\lambda 7$ are preferred in practice, because they provide more efficient transduction per corrugation wavelength, and, being larger than corrugations with wavelengths $\lambda 8-\lambda 15$, they are easier to make and they cause less weakening of the substrate.

An alternative method of determining the shape of the SAW attenuation curve is discussed in Rischbeiter, F.: "Measurements Of Surface Waves In Solids", *Acoustica* 1965, 16, pp. 75–83.

After the SAW attenuation characteristic is determined, additional devices may be fabricated using the same substrate material without further experimentation because the sinusoidal corrugation wavelength which is most effective in transducing a given SAW wavelength can be determined by inspection of the curve.

The foregoing has illustrated how the inventive device transduces certain spectral wavelengths $\lambda_R$ from the SAW spectrum emanating from a pair of input IDTs 13 and 15 and initially propagating from a flat piezoelectric substrate surface 23. Furthermore, it has been shown how the device may be fabricated to transduce any pre-selected SAW wavelength $\lambda_R$, by choosing and then fabricating the corrugation wavelengths, $\lambda$, in accord with the above procedure.

Figure 3:
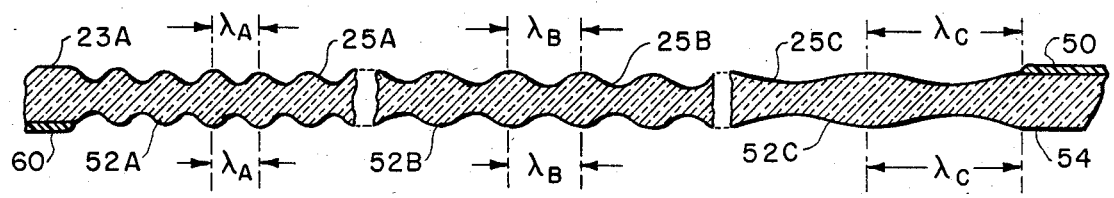
FIG. 3 is a side elevation cross sectional view of a first alternative preferred embodiment of the present invention.

FIG. 3 depicts an alternative preferred embodiment of the present invention. Reference numeral 11A is a piezoelectric substrate. Interdigital transducers (not shown) launch surface acoustic waves which propagate upon the flat upper surface 23A of the substrate 11A. A plurality of groups of sinusoidal corrugations 25A, 25B, and 25C is cut into the upper surface 23A of the piezoelectric. The groups 25A, 25B, and 25C are in the path of the surface acoustic waves emanating from the interdigital transducers. Each group of corrugations has a different wavelength; group 25A has wavelength $\lambda_A$; group 25B has wavelength $\lambda_B$; group 25C has wavelength $\lambda_C$. Each of the groups 25A, 25B, and 25C, scatters a specific SAW wavelength into bulk vibration. The lower surface of the piezoelectric substrate 11A has three groups of sinusoidal corrugations, 52A, 52B, 52C, corresponding to the three groups 25A, 25B, and 25C, located upon the top surface. The wavelength of group 52A is $\lambda_A$, the wavelength of group 52B is $\lambda B$, and the wavelength of group 52C is $\lambda_C$. Group 52A, positioned on the bottom of the substrate has the same wavelength as group 25A which is positioned directly above it, and so on. Each of the groups of sinusoidal corrugations on the bottom of the substrate 11A, intercepts the bulk acoustic vibration emanating from the corresponding corrugations on the top of the substrate and converts (with very little loss) the bulk vibration back into SAW vibration. The SAW vibration propagates upon the bottom surface of the piezoelectric 11A until it ultimately encounters the output IDTs (not shown) located upon surface 54.

For example, suppose the SAW attenuation curve for the substrate of FIG. 3 has a sharp attenuation peak at $\alpha_i = \lambda R/\lambda$, $i=1, 2$, (as mentioned before, for ST-cut quartz, $0.3 \leq \alpha_1 \leq 0.6$ and $1.4 \leq \alpha_2 \leq 2.05$) and it is desired to pass (i.e. transduce) only certain wavelengths, $\lambda_{R1}$, $\lambda_{R2}$, and $\lambda_{R3}$ which are present in the SAW spectrum emanating from the input IDTs. Then the corrugation wavelengths, $\lambda_A, \lambda_B, \lambda_C$, are chosen in accordance with the formulas:

$$\lambda A = \lambda_{R1}/\alpha_i$$

$$\lambda B = \lambda_{R2}/\alpha_i$$

$$\lambda C = \lambda_{R3}/\alpha_i$$

The foregoing discussion has illustrated the function of the inventive device in terms of its ability to transduce selected Rayleigh wavelengths from the surface wave spectrum emanating from input IDTs 13 and 15. Of course, the performance of the device may be discussed in terms of the frequency instead of wavelength. If $V_R$ is the speed of Rayleigh waves in the direction of propagation upon the substrate, then a Rayleigh wave with wavelength $\lambda_R$ is associated with a frequency, $f_R$, given by $f_R = V_R/\lambda_R$. Consequently, if the device is configured with sinusoidal corrugations 25A, 25B, and 25C on the top of the substrate and corresponding corrugations 52A, 52B, and 52C on the bottom of the substrate, all of which serve to transduce wavelengths $\lambda_{R1}$, $\lambda_{R2}$, and $\lambda_{R3}$, the device functions as a bandpass filter capable of selectively transmitting electric signal frequencies $f_{R1} = V_R/\lambda_{R1}$, $f_{R2} = V_R/\lambda_{R2}$, $f_{R3} = V_R/\lambda_{R3}$ from the input frequency spectrum of the input RF signal 21. If $R_1$, $R_2$ and $R_3$ are chosen close together, and $\lambda_{R1} < \lambda_{R2} < \lambda_{R3}$, then the spectral band of width $f_{R1} - f_{R3} = V_R/\lambda_{R1} - V_R/\lambda_{R3}$ will be most efficiently transduced from the input IDTs 13 and 15 to the output IDTs 33 and 35. Of course, for simplicity the attached figures show only a few corrugation wavelengths. The actual number of corrugation wavelengths required for effective attenuation depends upon the height of the SAW attenuation peak at $\alpha_1$ and $\alpha_2$. However, between 10 and 1000 corrugations on both top and bottom of the substrate will provide effective transduction.

Figure 8:
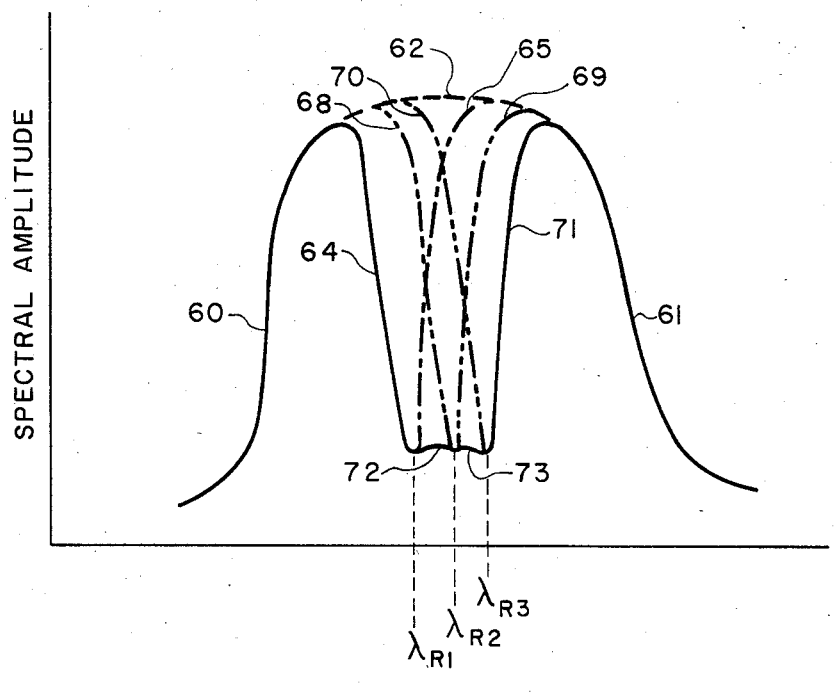
FIG. 8 is a graph of an intermediate spectral amplitude as a function of wavelength partially illustrative of the first alternative embodiment the function of the present inventive device.
Figure 10:
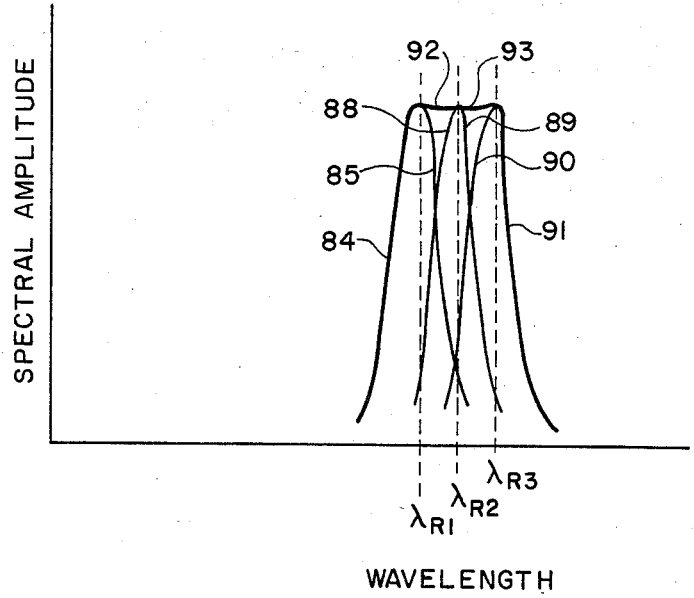
FIG. 10 is a graph of output spectral amplitude as a function of wavelength for another of the first alternative embodiment of the present invention.

FIGS. 8 and 10 are illustrative of the performance of the device described by FIG. 3. The graph of FIG. 8 shows that the spectral amplitudes of wavelength components $\lambda_{R1}$, $\lambda_{R2}$, and $\lambda_{R3}$ are strongly scattered by the corrugations 25A, 25B, and 25C illustrated in FIG. 3. The net effect of the three groups of corrugations is to notch a relatively broadband of wavelengths from the SAW spectrum emanating from the input IDTS 13 and 15 of FIG. 1. In FIG. 8, the SAW spectral envelope emanating from input IDTs 13 and 15 is represented by solid lines 60, 61 and phantom line 62. The spectral envelope defined by lines 60, 61 and 62 is equivalent to the envelope defined by line 63 of FIG. 6. Returning to FIG. 8, lines 64 and 65 indicate the notch cut from the spectral envelope of FIG. 6 by corrugations which strongly attenuate the wavelength $\lambda_{R1}$. The shape of the notch defined by lines 64 and 65 resembles the notch defined by lines 66 and 67 of the FIG. 7. Similarly, in FIG. 8, lines 68 and 69 define a notch cut from the spectral envelope by corrugations which strongly attenuate wavelength $\lambda_{R2}$, and lines 70 and 71 define a notch cut from the spectral envelope by corrugations which strongly attenuate wavelength $\lambda_{R3}$. Addition of the attenuation notches, 64-65, 68-69, and 70-71 yields the comparatively low spectral amplitudes denoted by lines 72 and 73. The graph of FIG. 8 may be considered representative of the SAW spectral amplitude which impinges upon surface 27 after traversing the three groups of corrugations 25A, 25B, and 25C. The energy associated with the graph of FIG. 8 is absorbed by the sound absorber 50 of FIG. 3 and does not substantially affect the output of the device measured between terminals 33 and 35 of FIG. 1. The comparatively low spectral amplitude between $\lambda_{R1}$ and $\lambda_{R3}$ denoted by lines 72 and 73 of FIG. 8 is associated with the scattering of wavelengths between $\lambda_{R1}$ and $\lambda_{R3}$ into bulk vibration. FIG. 10 is illustrative of the spectral amplitude of the surface acoustic vibrations observable on surface 54 of FIG. 3 and representative of the output of that preferred alternative embodiment. In FIG. 10 lines 84 and 85 designate the spectral envelope surrounding $\lambda_{R1}$. The spectral envelope defined by lines 84 and 85 represents the surface acoustic wave scattered by a group of corrugations on the top surface of a substrate and reconverted by the group of corrugations on the bottom surface of the substrate. Similarly lines 88 and 89 define a spectral envelope centered about $\lambda_{R2}$ and lines 90 and 91 define a spectral envelope centered about $\lambda_{R3}$. Addition of the 3 spectral envelopes centered about $\lambda_{R1}$, $\lambda_{R2}$, and $\lambda_{R3}$ yields lines 92 and 93. The composite spectral envelope defined by lines 84, 92, 93 and 91 represents the composite output spectral envelope which is transduced by the device of FIG. 3.

Figure 2:
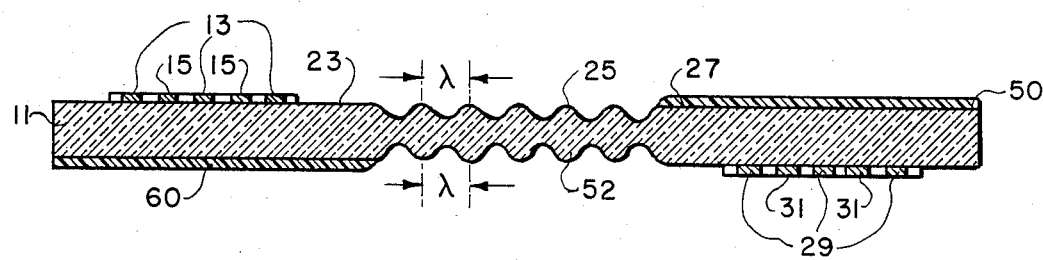
FIG. 2 is a side elevation cross sectional view of the device of FIG. 1, cut along the line 2—2 and looking in the direction of the arrows.
Figure 4:
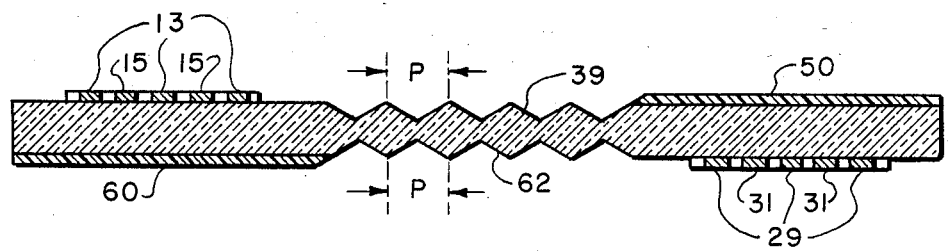
FIG. 4 is a side elevation cross sectional view of a second alternative embodiment of the present invention.

An alternative preferred embodiment of the present invention employs sawtooth-shaped corrugations instead of sinusoidal corrugations. To effectively transduce a particular SAW wavelength, $\lambda_R$, the sawtooth peak to peak distance P must correspond to the appropriate sinusoidal corrugation scattering wavelength $\lambda$. FIG. 4 is illustrative of the sawtooth embodiment. The peak-to-peak distance, p, in FIG. 4 is analogous to the sinusoidal corrugation wavelength, $\lambda$, of FIG. 2. The sawtooth corrugations 39 will strongly scatter incoming SAWs with acoustic wavelengths, $\lambda_R$ upon ST-quartz when, shown before $0.3p \leq \lambda R \leq 0.6p$ and $1.4p \leq \lambda R \leq 2.05p$. Sawtooth corrugations 62 on the bottom of the substrate will reconvert the bulk acoustic waves incident upon them to SAW vibration which is received by the output transducers.

Fabrication of sawtooth corrugations is somewhat simpler than fabrication of sinusoidal corrugations but provides somewhat less effective transduction, and therefore, a greater number of sawtooth corrugations is required to achieve any predetermined level of attenuation. Sawtooth corrugations may be fabricated by the previously mentioned ion milling or photolytic etching techniques disclosed in U.S. Pat. Nos. 4,388,146 and 4,389,275.

The illustrative embodiments herein are merely a few of those possible variations which will occur to those skilled in the art while using the inventive principles contained herein. Accordingly, numerous variations of the invention are possible while staying within the spirit and scope of the invention as defined in the following claims.

What is claimed is:

1. An acoustic surface wave device comprising:
   a substrate of material capable of supporting both surface acoustic waves and bulk acoustic waves, said substrate having first and second opposing surfaces;
   input means for launching surface acoustic waves along said first surface of said substrate;
   a first group of periodic corrugations disposed along said first surface of said substrate to scatter selective surface acoustic waves emanating from said input means into bulk acoustic waves, said first group of periodic corrugations having profiles with sloping sides;
   a second group of periodic corrugations of the same periodicity as said first group of corrugations, said second group being disposed along said second surface of said substrate and generally aligned with said first group, said second group of corrugations having profiles with sloping sides, said second group of corrugations being capable of converting selected bulk acoustic waves into selected surface acoustic wave vibrations which propagate along said second surface of said substrate; and
   output means for receiving said selected surface acoustic waves progagating along said second surface of said substrate.

2. The device of claim 1 further comprising means for absorbing unscattered surface acoustic waves disposed on said first surface of said substrate adjacent said first group of corrugations and opposite said output means.

3. The device of claim 2 further comprising means for absorbing surface acoustic waves disposed on said second surface of said substrate adjacent said second group of periodic corrugations and opposite said input means.

4. The device of claim 1
   further comprising a first plurality of groups of periodic corrugations disposed along said first surface of said substrate, each of said first groups having a different wavelength;
   a second plurality of like groups of periodic corrugations disposed along said second surface of said substrate, each of said second groups having the same wavelengths as respective ones of said first groups, and each of said second groups being generally aligned with the respective said first group having the same wavelength;
   each of said corrugation wavelengths of said first groups being capable of transducing surface acoustic waves of predetermined wavelengths from said first surface to bulk acoustic waves at said second surface of said substrate, and said corrugation wavelengths of said second groups being capable of transducing bulk acoustic waves of predetermined wavelengths into surface acoustic waves at said second surface providing a selective band of surface acoustic waves at said output means.

5. The device of claim 1 wherein said corrugations have a sinusoidal wave shape.

6. The device of claim 1 wherein said corrugations have a sawtooth wave shape.

7. The device of claim 1
   wherein said substrate is a piezoelectric material;
   said input means includes a source of electrical signals and a first interdigital transducer formed upon said first surface of said substrate and coupled to said source of signals, said interdigital transducer having a pair of opposed transducer pads from which extend alternating interdigitated electrode fingers for exciting a surface acoustic wave spectrum in response to an electrical signal applied thereto, the spacing S between the centers of adjacent electrode fingers being given by $S=\lambda_{RC}/2$ where $\lambda_{RC}$ is substantially the center of said acoustic wave spectrum;
   said output means is a second interdigital transducer formed upon said second surface of said substrate, said second interdigital transducer being configured substantially the same as said first interdigital transducer; and
   wherein acoustic waves have wavelengths $\lambda_{Ri}$ satisfying the relationship $$\lambda_{RC}-w/2 \leq \lambda_{Ri} \leq \lambda_{RC}+w/2$$

$i=1, \ldots n$
   wherein W is the effective width of said acoustic wave spectrum emanating from said input interdigital transducer.

8. The device of claim 2
   wherein said means for absorbing said surface acoustic waves comprises polyimide.

9. The device of claim 2 wherein said means for absorbing said surface acoustic waves comprises resin.

10. The device of claim 2
    wherein said substrate is SST-cut quartz.

11. The device of claim 2
    wherein said substrate is ST-cut quartz having an attenuation response curve as a function of the ratio of acoustic wavelength to corrugation wavelength including two peak attenuation points $\alpha_1$ and $\alpha_2$ wherein; and
    $\alpha_1$ is between 0.3 and 0.6
    and
    $\alpha_2$ is between 1.4 and 2.05.

12. A method of bandpass filtering capable of selectively transmitting a desired surface acoustic wavelength, $\lambda_R$, ofa broadband surface acoustic wave spectrum propagating upon the surface of a substrate having an input means disposed upon a top surface of said substrate and an output means disposed upon a bottom surface of said substrate comprising the steps of;
    forming a first group of periodic corrugations of wavelength $\lambda$ upon said top surface capable of scattering surface acoustic waves of wavelength $\lambda_R$ into bulk acoustic waves;

forming a second group of like periodic corrugations upon said bottom surface of said substrate capable of converting said bulk acoustic waves into surface acoustic waves of wavelength $\lambda_R$, said second group of corrugations being generally aligned with said first group, both said first group and said second group having a period, "p", being given by the formula:

$$P = \lambda_R/\alpha_i$$

$i = 1, 2$ where $\alpha_i$ is a maximal value of the ratio of wavelengths $\lambda_R/\lambda$ of the surface wave attenuation curve for said substrate;

applying a source of said acoustic waves to said input means; and receiving the surface acoustic waves of wavelength, $\lambda_R$, of said output means.

13. A method of bandpass filtering capable of selectively transmitting a desired electrical frequency component, $f_R$, of an electrical broadband signal spectrum comprising the steps of:

forming an input interdigital transducer upon the top surface of a piezoelectric substsrate;

forming an output interdigital transducer upon the bottom surface of a piezoelectric substrate;

forming a first group of periodic corrugations of wavelength $\lambda$ upon said top surface of said substrate, capable of scattering surface acoustic waves of wavelenth, $\lambda_R$ equal to $V_R/f_R$ where $V_R$ is the velocity of surface wave propagation upon said surface of said substrate into bulk acoustic waves;

forming a second group of like periodic corrugations upon said bottom surface of said substrate, capable of converting bulk acoustic waves of wavelength equal to $V_R/f_R$ into surface acoustic waves, said second group of corrugations being generally aligned with said first group, both said first group and said second group having a period, "p", being given by the formula:

$$P = V_R/(\alpha_i \times f_R)$$

$i = 1, 2$ where $\alpha_i$ is a maximal value of the ratio of the wavelengths $\lambda_R/\lambda$ of the surface wave attenuation curve for said substrate;

applying a source of said electrical broadband signal spectrum to said input interdigital transducer;

receiving the filtered electrical signal emanating from said output interdigital transducer.

* * * * *